US009501930B2

(12) United States Patent
Smith et al.

(10) Patent No.: US 9,501,930 B2
(45) Date of Patent: Nov. 22, 2016

(54) POWER LINE PROXIMITY SENSING AND WARNING SYSTEM (71) Applicant: United Safety, Inc., Kalispell, MT (US)

(72) Inventors: Stephen L. Smith, Kalispell, MT (US); Mark C. Olson, Racine, WI (US); Ryan W. Johnson, Bigfork, MT (US)

(73) Assignee: UNITED SAFETY, INC., Kalispell, MT (US)

( * ) Notice: Subject to any disclaimer, the term of this patent is extended or adjusted under 35 U.S.C. 154(b) by 0 days.

(21) Appl. No.: 13/730,827

(22) Filed: Dec. 28, 2012

(65) Prior Publication Data

US 2014/0184425 A1   Jul. 3, 2014

Related U.S. Application Data (60) Provisional application No. 61/580,918, filed on Dec. 28, 2011.

(51) Int. Cl.
G08B 21/00 (2006.01)
G08G 1/0962 (2006.01)
H02H 5/12 (2006.01)
G01R 29/08 (2006.01)
G01V 3/10 (2006.01)
G01V 3/15 (2006.01)

(52) U.S. Cl.
CPC ........... *G08G 1/0962* (2013.01); *G01R 29/085* (2013.01); *G01V 3/10* (2013.01); *G01V 3/15* (2013.01); *H02H 5/12* (2013.01)

(58) Field of Classification Search
None
See application file for complete search history.

(56) References Cited

U.S. PATENT DOCUMENTS

| 3,786,468 | A | * | 1/1974 | Moffitt | 340/515 |
| 3,907,136 | A | * | 9/1975 | Christides et al. | 414/694 |
| 5,252,912 | A | * | 10/1993 | Merritt et al. | 324/72 |
| 5,592,092 | A | * | 1/1997 | Mechler | 324/326 |
| 6,104,305 | A | | 8/2000 | Beckmann | |
| 6,133,841 | A | | 10/2000 | Beckmann | |
| 6,170,607 | B1 | | 1/2001 | Freeman et al. | |
| 6,252,513 | B1 | | 6/2001 | Beckmann | |
| 6,600,426 | B1 | * | 7/2003 | Sacks et al. | 340/664 |
| 7,081,812 | B2 | | 7/2006 | Hastings, Sr. | |
| 2004/0066284 | A1 | | 4/2004 | Hastings, Sr. | |
| 2006/0271263 | A1 | * | 11/2006 | Self et al. | 701/50 |
| 2007/0018841 | A1 | | 1/2007 | Nickerson | |
| 2009/0237263 | A1 | * | 9/2009 | Sawyer et al. | 340/686.6 |
| 2010/0214094 | A1 | | 8/2010 | Givens et al. | |
| 2010/0286845 | A1 | * | 11/2010 | Rekow et al. | 701/2 |

FOREIGN PATENT DOCUMENTS

EP   2 479 735 A2 *  7/2012

OTHER PUBLICATIONS

Installation Procedure for the ASE 2200 High Voltage Proximity Warning Device, Allied Safety Engineering, Feb. 21, 2006.
Sigalarm Model 110 Lattice Boom Manual, Sigalarm, 5224 West State Road 46 PMB 405, Sanford, FL 32771, 2010.
http://www.alliedsafetyeng.com/proximity_warning_device.html, Allied Safety Systems, Inc., 4380 St. Johns Parkway, Suite 100 Sanford, FL 32771, 2009.
http://www.wirewatcher.co.uk/wwprd.html, The Wire-Watcher Co. Ltd, Gigg Mill, Old Bristol Rd, Nailsworth GL6 0JP, United Kingdom, 2005.

* cited by examiner

*Primary Examiner* — Julie Lieu
(74) *Attorney, Agent, or Firm* — Hamre, Schumann, Mueller & Larson, P.C.

(57) ABSTRACT

A power line proximity sensing and warning system. The embodiments disclosed herein may be configured as stand-alone systems or may be used in conjunction with each other or with other conventional systems.

21 Claims, 4 Drawing Sheets

POWER LINE PROXIMITY SENSING AND WARNING SYSTEM

CROSS-REFERENCE TO RELATED APPLICATIONS

This nonprovisional patent application claims benefit and priority under 35 U.S.C. §119(e) of the filing of U.S. Provisional Patent Application No. 61/580,918 filed on Dec. 28, 2011, titled "POWER LINE PROXIMITY SENSING AND WARNING SYSTEM", the contents of which are expressly incorporated herein by reference as if fully set forth herein. This nonprovisional patent application also claims benefit and priority under 35 U.S.C. §119(e) of the filing of U.S. Provisional Patent Application No. 61/747,187 filed on Dec. 28, 2012, titled "VOLTEK NS SYSTEM", the contents of which are also expressly incorporated herein by reference as if fully set forth herein.

BACKGROUND OF THE INVENTION

Field of the Invention

The present invention relates generally to proximity sensors. More particularly, this invention relates to power line proximity sensing and warning systems, for enhanced safety of operators and their machinery around high voltage power lines. The embodiments disclosed herein may be configured as standalone the power line warning device (PWD) systems or may be used in conjunction with each other or with other conventional PWD systems.

Description of Related Art

Conventional power line proximity alarms are electronic radio units designed to detect the electromagnetic field that surround active high voltage power lines. This electromagnetic field is detected or sensed, thereby generating warning sounds to alert the operator of the machinery equipped with the power line warning device (PWD), that a high voltage has been detected within the vicinity of the machine.

Currently, the PWD market offers products that are analog based (fused). Such systems are purchased individually and perform a simple and single function of warning when an equipped piece of machinery is approaching a high voltage power line.

SUMMARY OF THE INVENTION

The embodiments of the invention disclosed here provide a user-friendly approach to power line safety through a full line of completely digital and highly technical products that are interactive, collective, supportive of each other, simple to operate and ancillary to a base/main unit that can be configured in an array of combinations to accommodate any articulating, overhead boomed or extending mobile equipment type. The embodiments disclosed herein are believed to be more accurate, dependable than conventional systems and include a wider range of options and features that no other PWD on the market offers.

BRIEF DESCRIPTION OF THE DRAWINGS

The following drawings illustrate exemplary embodiments for carrying out the invention. Like reference numerals refer to like parts in different views or embodiments of the present invention in the drawings.

DETAILED DESCRIPTION OF THE INVENTION

The invention includes a novel suite of power line proximity sensing and warning systems, having a base or general configuration that may be upgraded with various enhanced feature embodiments and still other embodiments which may be incorporated into existing PWD systems. The embodiments disclosed herein may be configured as standalone PWD systems or may be used in conjunction with each other or with other conventional PWD systems.

The various embodiments of the present invention provide a user-friendly approach to power line safety by manufacturing a full line of completely digital and highly technical products that are interactive, collective, supportive of each other, simple to operate and ancillary to a base/main unit that can be configured in an array of combinations to accommodate any articulating, overhead boomed or extending mobile equipment type. We believe our designs are more accurate, dependable and offer a wider range of options and features that no other PWD on the market offers. The following is a description of the various embodiments of power line proximity sensing devices, accessories and enhancements according to the present invention.

Figure 1:
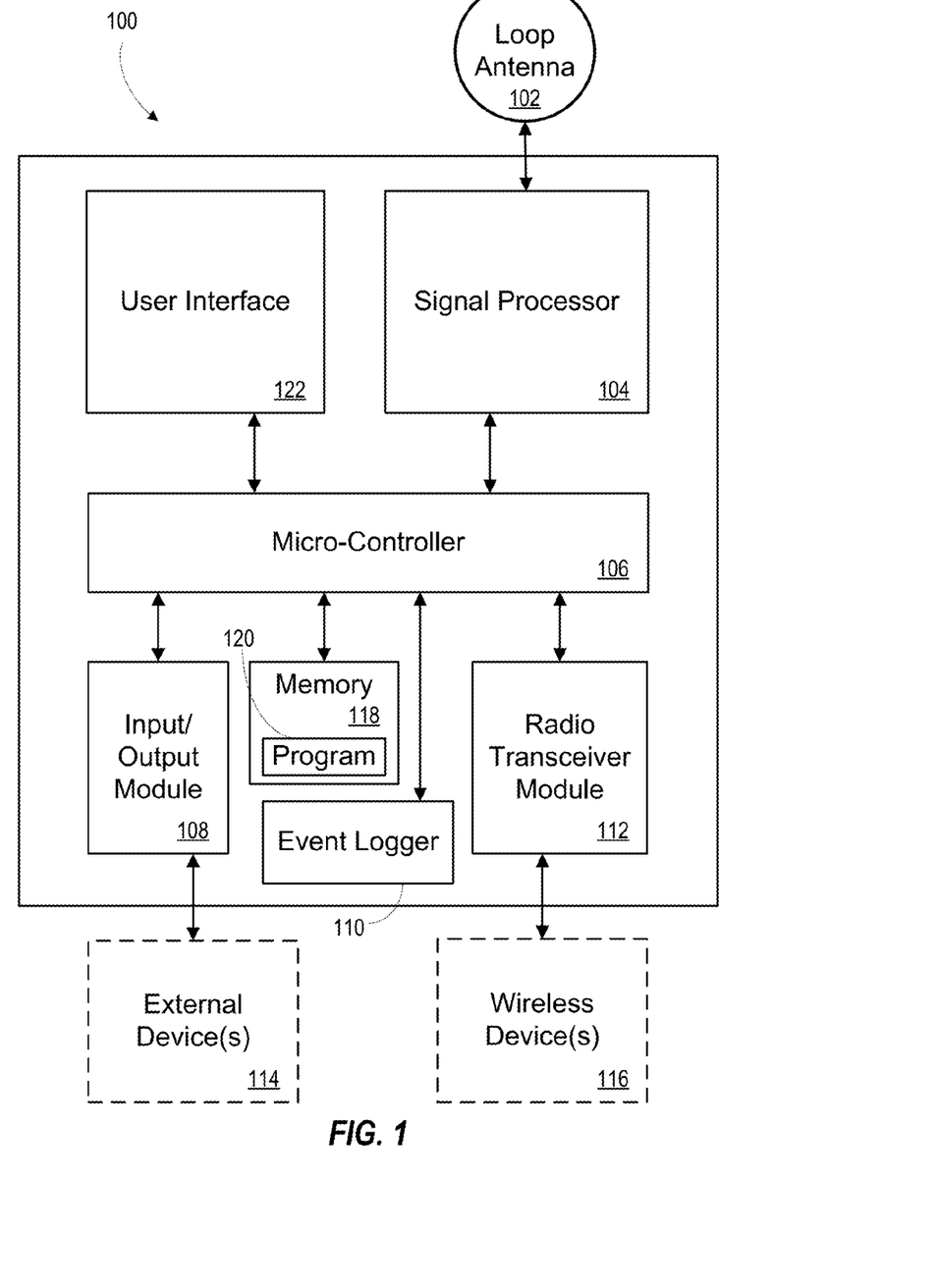
FIG. 1 is a block diagram of an embodiment of a power line proximity sensing and warning system, according to the present invention.

FIG. 1 is a block diagram of an embodiment of a power line proximity sensing and warning system 100 for use by an operator of machinery operating near high-voltage power lines, according to the present invention. A commercial embodiment of system 100 is known as Voltek NS™ is available from United Safety, Inc., Kalispell, Mont. System 100 may include a loop antenna 102 disposed about a structure (not shown) of the machinery (not shown). The structure, e.g., a crane boom, is generally configured for movement near the power lines. Antenna 102 runs along the boom of the machinery. The antenna is a loop of wire with both ends connected to the signal processor 104 input. One embodiment of the signal processor 104 processes and filters the incoming signal and includes the following features, 60 band-pass filter, dynamics compression (apply a specific response curve), gain, and read signal amplitude.

The loop antenna 102 may be in communication with a signal processor 104. Signal processor 104 may be a digital signal processor or any other suitable signal processor capable of sending test signals through the loop antenna 102 and receiving those test signals to confirm proper antenna operation. Signal processor 104 may also be configured for receiving field strength signals from the loop antenna 102 generated by an electromagnetic field generated by the power lines (not shown, but see FIG. 3 and related discussion) proximate to the loop antenna 102.

The system periodically performs an antenna self-test: Normally, both ends of the antenna wire are connected to the DSP Input For self-test mode, a set of relays disconnects one end from the DSP Input and connects it to the DSP Output The DSP outputs a 60 Hz sine wave test signal. If the antenna 102 is in working condition, the test signal will go through the antenna wire into the DSP Input. If the test signal can be detected, the test is Passed.

System 100 may also include a micro-controller 106 in communication with the signal processor configured for interpreting the received field strength signals from the loop antenna and comparing the received field strength signals to a user-adjustable, sensitivity level. Sensitivity adjustments allow the operator to set a warning distance based on the strength of the electromagnetic field surrounding the power line. Micro-controller 106 may further be configured for generating a proximity signal based on the received field strength signal. Micro-controller 106 may further be configured for graphically displaying the proximity signal on a color display, and audibly warning the operator when the proximity signal exceeds preset levels of field sensitivity.

The micro-controller 106 may be configured to read the signal amplitude and calculates a value based on the user-adjustable sensitivity level. The reading is displayed on a color-coded display meter. The three levels displayed are:

GREEN—Safe Zone: the equipment is operating in at a safe distance from power lines.

YELLOW—Warning Zone: the equipment is operating closer to power lines than the set safe distance. The Warning indicator turns on and the horn emits a pulse tone, reminding the operator to back the equipment away from the power lines until it is in the Safe Zone.

RED—Danger Zone: the equipment is dangerously close to power lines. The shutdown indicator turns on, the horn emits a solid tone, and the equipment is forced to shut down by engaging the Emergency Stop system, (e.g., emergency shutdown button 206, FIG. 2).

System 100 may further include an input/output (I/O) module 108 in communication with the micro-controller 106. The I/O module 108 may be configured for communicating with external devices, e.g., other computers or computer peripherals for retrieving data from the system 100 or for programming system 100. Communications through the I/O module 108 may be according to any known serial or parallel synchronous or asynchronous interface standard, e.g., universal serial bus (USB). Such computer data communications interfaces are well-known to those skilled in the art and, thus, will not be further elaborated herein.

System 100 may further include an event logger 110 in communication with the micro-controller 106 for recording user interface button presses, user interface sensitivity adjustments, received field strength signals, alerts generated, alarms generated, system cable connections, power loss, errors and system status, all as a function of time. According to one embodiment, an integrated event logger is capable of generating a record of these events. These records can be accessed by any suitable computer (external device, shown at dotted box 114) installed with an appropriately coded software program, referred to herein as Voltek Systems™ Core™ software (not shown). The event logger 110 may include an internal date/time clock with a battery power backup to keep it running even when the system 100 is disconnected from power. Whenever such an external computer running Voltek Systems™ Core™ software downloads events from system 100, it automatically synchronizes the event logger 110 clock with the computer's clock.

System 100 may further include a radio transceiver module 112 in communication with the micro-controller 106. The radio transceiver module 112 may be configured for wireless communication with external wireless devices. System 100 may further include memory 118 in communication with micro-controller 106. Memory 118 may be configured to store data from the event logger 110 or software programming code (program 120) with instructions for operating the micro-controller 106. According to one embodiment, a USB wireless adapter allows an external computer running Voltek Systems™ Core™ to wirelessly download events and perform other actions without having to connect a USB cable directly to system 100, however the option of doing so is available through I/O module 108.

Figure 2:
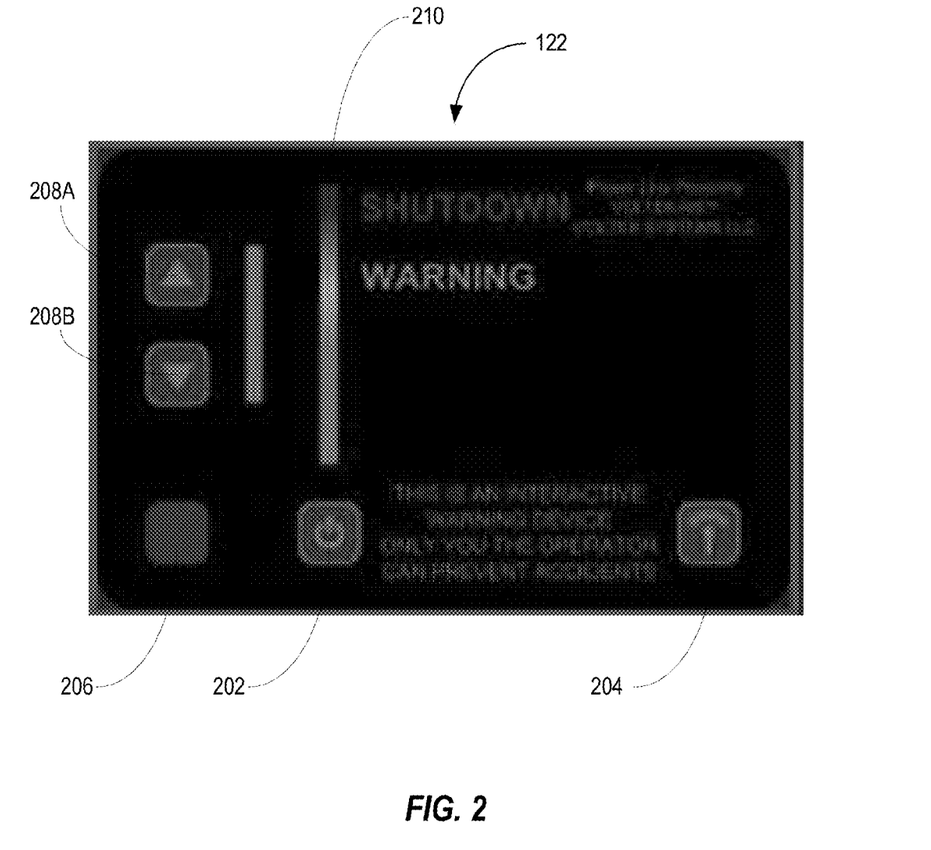
FIG. 2 is an embodiment of a user interface for use with the power line proximity sensing and warning system shown in FIG. 1, according to the present invention.

FIG. 2 is an embodiment of a user interface 122 for use with the power line proximity sensing and warning system 100 shown in FIG. 1, according to the present invention. User interface 122 may include a power button 202 used to turn the system 100 on and off. User interface 122 may also include a wireless link button 204 for wirelessly linking the system 100 with one or more remote wireless devices. According to one embodiment, a two-way digital messaging system allows communication with remote wireless accessories over the radio transceiver module 112. User interface 122 may also include an emergency shutdown button 206 that stops the machinery from further movement. User interface 122 may also include sensitivity adjust up 208A and down 208B buttons for manually configuring the sensitivity of system 100. User interface 122 may also include a graphical display using a red-yellow-green field strength bar 210. The graphical display may further include "shutdown" and "warning" indicators that flash or illuminate, according to the illustrated embodiment.

The Voltek Shadow™, available from United Safety, Inc., Kalispell, Mont. (the assignee of this application) is a remote control (see FIG. 3, 314) for system 100, an embodiment known as Voltek NS™ is also available from United Safety, Inc. The Voltek Shadow™ is a battery-powered remote controller (see FIG. 3, 314) for system 100, also referred to herein as Voltek NS™ or the Voltek NS™ Powerline Proximity Alarm. The Voltek Shadow™ uses two-way radio communication (radio transceiver 112) to allow remote operation and view the status of the main unit while operating the equipment from outside the cab or when a spotter needs to monitor powerline safety from an outside viewpoint.

Unlike many conventional remote control devices, any The Voltek Shadow™ can be easily linked to any Voltek NS™ (system 100) without the hassle of connecting a cable, shipping the units to the manufacturer to be reprogrammed, or entering codes. Simply turn on both devices, press the link button on each device, and point the Voltek Shadow™ at the Voltek NS™. The units instantly recognize each other and establish a radio link. This is very useful in situations where you have multiple units in charging cradles. Simple grab any one of them, take it to the equipment you will be using for that day, and link the devices together. According tone embodiment, he Voltek Shadow™ has the exact same controls as the Voltek NS™ with the addition of a "panic button" that lets a spotter either warn the operator of a hazard or shutdown the machine remotely to prevent an accident. The Voltek Shadow™ also alerts the user when radio communication has been lost or the battery is low. Voltek Shadow™ has a serial number, so each main unit can establish a link with a specific remote unit without interfering with other nearby units. A proprietary messaging system sends messages between units to communicate button presses, sensor readings, status changes, event log data, etc. The Link button 204 on user interface 122 of system 100 may include an Infrared LED under it. The Voltek Shadow™ enclosure may include an Infrared receiver under an infrared-passing window in the front of the enclosure.

The remote unit links to the main unit like this:
Turn on both units
press the Link button on each unit
point the remote at the main unit. The main unit transmits an ID code to the remote unit via an Infrared transmitter.
The remote uses the ID code to establish a digital radio link with the main unit. The ID code tells the remote what "address" to send messages to when transmitting messages over the radio.

Figure 3:
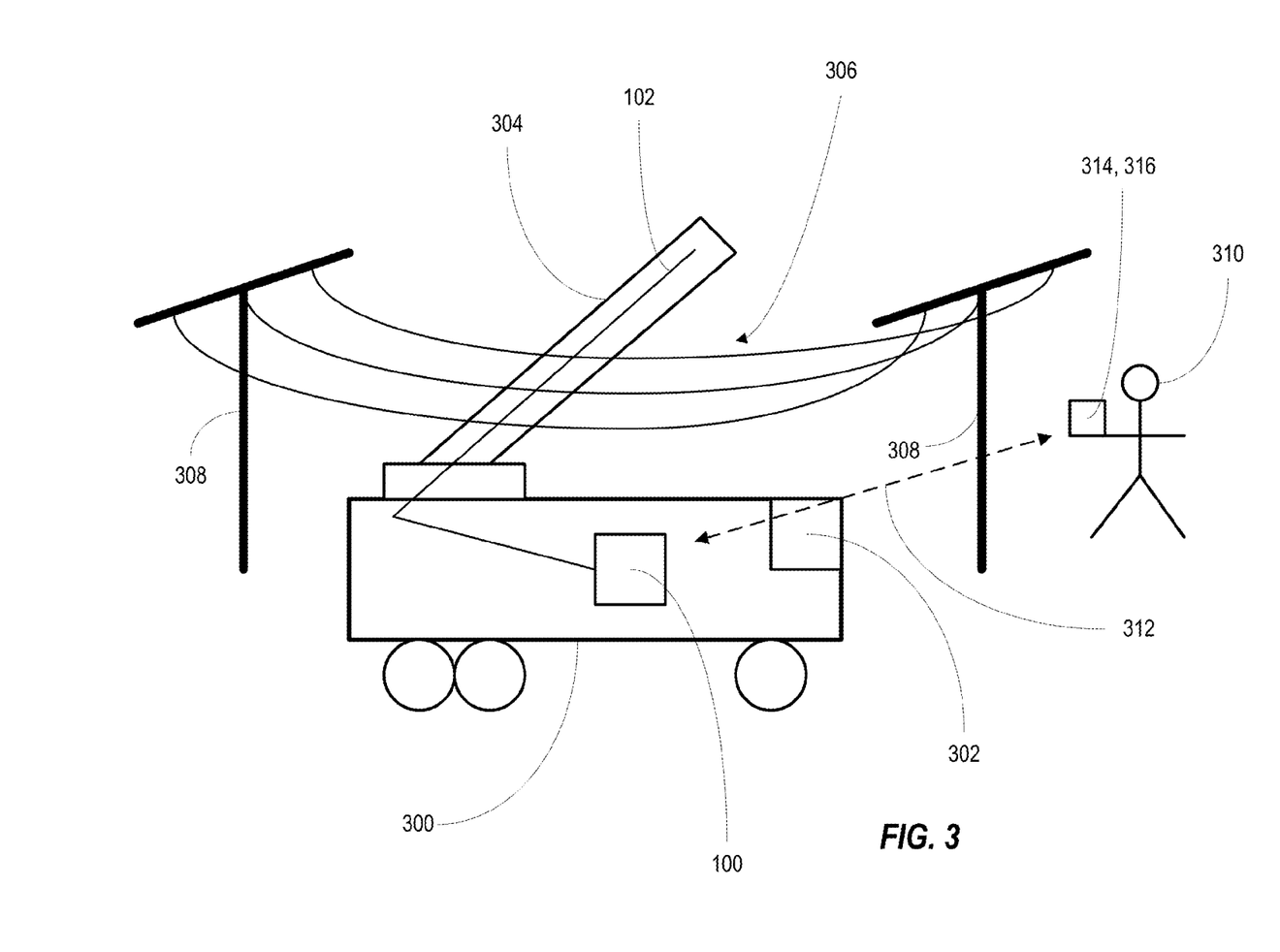
FIG. 3 is a schematic diagram of an environment in which the power line proximity sensing and warning system shown in FIG. 1 might be used, according to the present invention.

FIG. 3 is a schematic diagram of an environment in which the power line proximity sensing and warning system 100 shown in FIG. 1 might be used, according to the present invention. As shown in FIG. 3, a machinery 300 operated by an operator 302 may have an extended structural member, simply structure 304. System 100 once installed, includes the loop antenna 102 disposed about the surface of the structure 304, where it can sense invisible electromagnetic fields from power lines (three shown generally at arrow 306). In the configuration shown in FIG. 3 the operator 302 has access to the user interface 122 of system 100, typically in the cab of the machinery. From that position, operator 302 can control the system 100 directly. Alternatively, a remote user 310 can control system 100 using a wireless remote controller 314, e.g., the Voltek Shadow™. Remote user may also be holding a wireless computer 316 running Voltek Systems™ Core™ software.

Figure 4:
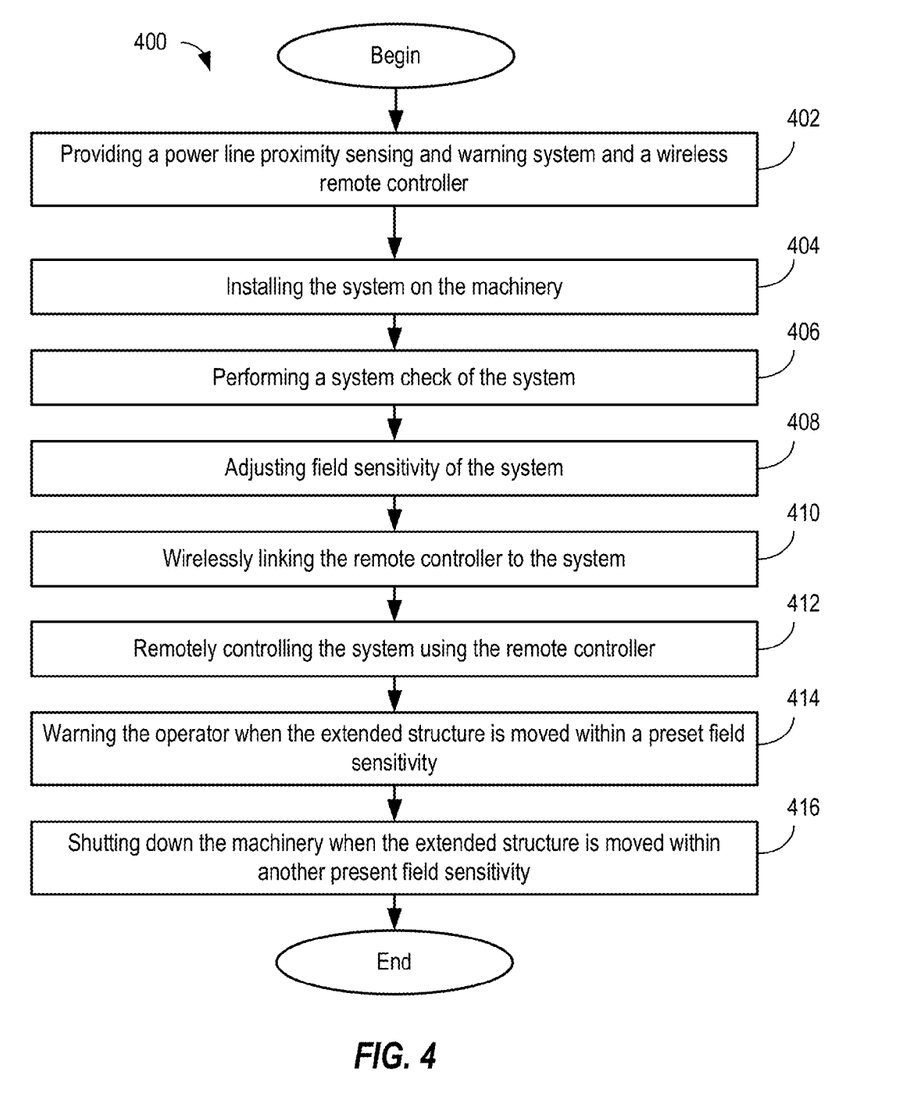
FIG. 4 is a flowchart of an embodiment of a method for remotely alerting an operator of machinery when an extended structure of the machinery is moved near high voltage power lines, according to the present invention.

FIG. 4 is a flowchart of an embodiment of a method for remotely alerting an operator of machinery when an extended structure of the machinery is moved near high voltage power lines, according to the present invention.

An upgraded feature referred to herein as "Voltsense™", may be added to the "Voltek NS™" embodiment in order to form a wireless antenna sensor PWD system. Another embodiment, referred to herein as "Voltek Shadow™" is a hand held remote for use with the general "Voltek NS™" embodiment, with or without the "Voltsense™" upgrade, for spotters or operators controlling machinery remotely. Another upgrade embodiment, referred to herein as "Line Defense WL™", replaces the wired sensor antenna of the "Voltek NS™" embodiment with access to the load cable as a wireless sensor antenna by way of a novel connector referred to herein a "Pour Cap Link™". Still another upgrade embodiment, referred to herein as "Line Defense WD™", extends the wired sensor antenna of the "Voltek NS™" embodiment with access to the load cable as a sensor antenna by way of the "Pour Cap Link™" connector. Yet another embodiment, referred to herein as "Voltek Scribe™" is an upgrade for use with any of the above PWD embodiments and may also be used with other conventional PWDs as an event logger and data recorder. Finally, the "Voltek PD™" embodiment is disclosed. The "Voltek PD™" is a completely standalone PWD device for use on a single person, e.g., first responders, tree trimmers, lineman, etc.

Voltek NS™

A general PWD embodiment, referred to herein as "Voltek NS™", includes a wired antenna sensor. In its most general embodiment, the Voltek NS™ is a PWD for heavy machinery and motorized equipment that warns the operator, spotter, ground crew and by-standers when the machinery is approaching active high voltage power lines. According to one embodiment, the Voltek NS™ detects both 50 Hz and 60 Hz without re-programming or manual setting. U.S. Provisional Patent Application No. 61/747,187 filed on Dec. 28, 2012, titled "VOLTEK NS SYSTEM", the contents of which are expressly incorporated herein by reference as if fully set forth herein, discloses engineering drawings, schematics and bills of materials for a presently preferred embodiment of a power line proximity sensing and warning system, according to the present invention.

To detect electrostatic, or electromagnetic fields, an antenna wire must be connected and placed in or near the field lines emanating from the electromagnetic field source, e.g., high voltage power lines. To ensure that the antenna wire is completely intact, the antenna is looped. Both ends are connected to a control board so that a continuity check can be performed. If there is a break in the wire, an error indicator on the control panel alerts the operator. All basic Voltek NS™ units come with the hard wire antenna. However, this embodiment is configured to be equipped with wireless capability should the owner choose to upgrade to a wireless sensor in the future.

Voltek NS™ utilizes the most modern technologies. Digital signal processors and microprocessors ensure precise and reliable operation of the Voltek NS™. Updatable firmware allows features and behavior to be modified on-site without changing hardware, should the need arise. According to one embodiment, the Voltek NS™ may be configured to operate on 12V or 24V power systems without any changes or need for external converter. Self-resetting circuit protection eliminates the need to replace fuses. Modern digital radio transceivers are utilized for wireless communication with various accessories.

The Voltek NS™ is typically mounted inside the cab of the machine where the operator can interact with the system. Sensitivity adjustments allow the operator to set a warning distance based on the strength of the electrostatic field surrounding the high voltage power line. When the equipment moves inside the set distance, audible and visual alerts are activated. If the operator continues to move toward the power line, the Voltek NS™ can automatically shut down the machinery to prevent contact with the power line. A light emitting diode (LED) bar graph on the control panel indicates the detected field strength and whether the warning or auto-shutdown thresholds have been exceeded.

All Voltek NS units come equipped with an internal "event logger/data recorder" (Voltek Scribe™ technology as described below). Software implementing the method embodiments of the present invention through computer instructions for execution in a microprocessor or other specialized hardware, may be provided at the point of purchase. The software may be loaded onto owner computer (e.g., Windows 7™ or newer). The computer then, by Voltek NS™ universal serial bus (USB) connection, downloads the stored data into the pre-loaded software program for interpretation of the owner as well as view diagnostics, error information, change options and/or upload new firmware and upgrades.

Voltek Shadow™

The Voltek Shadow™ is a wireless hand held remote and alert unit providing the same adjustments and status indicators as the main unit (Voltek NS™). The Voltek Shadow™ is synchronized with the main unit at all times. This wireless remote is useful when the operator is remotely controlling the machinery (e.g., concrete pumps, conveyor s trucks, etc.) or when a spotter needs to observe operation from a ground position.

Voltek Shadow™ has override capabilities to shut down the machinery before or when power line contact is eminent or the operator is maneuvering the machinery blind (cannot see the load). Voltek Shadow™ uses the latest in advanced technology available in wireless, microprocessing and re-chargeable LI battery technology.

VoltSense™

The VoltSense™ feature incorporates wireless remote sensors to the system (Voltek NS™) in order to ensure complete coverage of the machinery without the need of a hard wire antenna. Wireless sensors can be powered by various sources and may be provided in various detecting configurations, according to embodiments of the present invention.

Due to the nature of existing wireless antenna sensing, the sensing or detecting field is typically radial or round in shape. By addition of an external micro-antenna to the wireless sensor and continuing it to a given point, the sensing field becomes linear or elongated, thus, eliminating the need for additional sensors to cover a linear area or object such as a boom or extension.

According to one embodiment, mounting of VoltSense™ may be achieved by magnetic coupling to metallic structure of the machine to which it is attached. According to other embodiments, the VoltSense™ may be mechanically mounted to the machine structure. According to one embodiment, the power source for VoltSense™ may be the latest lithium (LI) battery technology with solar backup and recharge options. However, any suitable power source may be used with the embodiments of the invention described herein.

To establish a wireless link between the main unit (Voltek NS™) and the wireless remote units and sensors, a link cable is connected between the units. Once the link has been established and the units synchronized, the cable is unplugged and the devices will communicate with each other within their own wireless network without interference from other nearby Voltek NS™ systems. If any associated device loses its communication link, an error indicator will alert the operator at the Voltek NS™ and Volt Shadow™ control panels.

Line Defense WL™

The Line Defense WL™ is a wireless load line sensor. Again, utilizing the same wireless technology as with Voltek NS™, Voltek Shadow™ and VoltSense™, this wireless utility is the first of its kind in the world. Never before has any PWD manufacturer been able to protect the load line of a crane or mobile machinery. By attaching a proprietary connection (referred to herein as Pour Cap Link™ and discussed further below), wireless sensor, microprocessor and additional hardware to either end of the load line (lifting cable) of a crane, the sensor utilizes the load line as an extension of itself though that connection by unconventional (never realized) means. Thus the cable not only is protected but becomes part of the sensor itself. Line Defense WL™ is powered by the latest in LI technology and solar back-up and re-charge.

Line Defense WD™

The Line Defense WD™ is a wired load line sensor. Line Defense WD™ is a method of load line protection that is directly attached to the cable/load line through the Pour Cap Link™ connection at either end of the cable/load line of a crane with the Voltek NS™ hard wire antenna. Before now, the load line has been considered a single strand conductor (wire) due to way a cable is made. Therefore, a loop cannot be obtained to complete the continuity of the antenna. The inventors have designed a connection (Pour Cap Link™) that allows Voltek NS™ system to utilize the cable/load line as an extension of the sensor/antenna. Line Defense WD is a method of sensing the electrostatic field through the load line/cable powered by the main unit Voltek NS™.

Voltek Scribe

The Voltek Scribe™ is an event logger and data recorder. The Voltek Scribe™ utilizes the same technology as described above and utilized internally within Voltek NS™. The Voltek Scribe™ may be used to time and date stamp the events of any PWD. The Voltek Scribe™ comes with software for Microsoft Windows XP™ and is compatible with newer versions of operating systems and computers/laptops. According to one embodiment, the Voltek Scribe™ may be configured to store up to 3500 events. The Voltek Scribe™ may be configured to download events, view diagnostics, change options and upload new firmware to computer though an external USB port. The Voltek Scribe™ may be powered by direct connection to the battery of the machine to which it is attached or installed.

Voltek PD™

The Voltek PD™ is smaller personally worn power line sensing and warning device. The Voltek PD™ may be thought of as a condensed version of the Voltek NS™. The Voltek PD™ may be worn on the body with various carry or attachment options (clip, pouch, etc.). The Voltek PD™ may be configured with all the same features (with exception of "event logger") as Voltek NS™ with the freedom of Voltek Shadow™. The Voltek PD™ may be configured with the following features: compact (2 way radio size), audio alert, LED warning and function indicators, back-lit control panel (for night/dark conditions), waterproof, impact resistant, re-chargeable LI battery technology with charging cradle.

Pour Cap Link™

The Pour Cap Link™ is a novel connector that is monolithically attached to the end of the machine load cable. Once the Pour Cap Link™ is attached to the load line cable, either one of the Line Defense WL™ or the Line Defense WD™ can then be attached to the Pour Cap Link™ in order to utilize the load cable as part of the system sensor. Pour Cap Link™ is a "hyper-link" that magnifies or amplifies the system sensor at the load cable end. The Pour Cap Link™ is unique in that it amplifies the signal and makes a single wire/conductor (the load cable) into a closed loop sensing system.

While the foregoing advantages of the present invention are manifested in the illustrated embodiments of the invention, a variety of changes can be made to the configuration, design and construction of the invention to achieve those advantages. Hence, reference herein to specific details of the structure and function of the present invention is by way of example only and not by way of limitation.

What is claimed is:

1. A power line proximity sensing and warning system for use by an operator of machinery operating near a high-voltage power line, comprising:

a loop antenna disposed on a structure of the machinery that is movable near the power line;

a signal processor in communication with the loop antenna, the signal processor configured to send test signals through the loop antenna and receive field strength signals from the loop antenna generated by an electromagnetic field from the power line; and a micro-controller in communication with the signal processor that interprets the received field strength signals and compares the received field strength signals to first and second preset, user-adjustable sensitivity levels, generates is proximity signal, graphically displays the proximity signal on a color display, causes an audible signal to be generated to audibly warn the operator when the proximity signal exceeds the first preset sensitivity level, and automatically shuts down the machinery when a received field strength signal exceeds the second preset sensitivity level, wherein the second preset sensitivity level exceeds the first preset sensitivity level, and each of the first preset sensitivity level and the second preset sensitivity level is user adjustable.

2. The system according to claim 1, further comprising an input/output (I/O) module in communication with the micro-controller, the I/O module configured for communicating with external devices.

3. The system according to claim 1, further comprising an event logger in communication with the micro-controller for recording user interface button presses, user interface sensitivity adjustments, received field strength signals, alerts generated, alarms generated, system cable connections, power loss, errors and system status, all as a function of time.

4. The system according to claim 1, further comprising a radio transceiver module in communication with the micro-controller, the radio transceiver module configured for wireless communication with external wireless devices.

5. The system according to claim 4, further comprising a remote controller in communication with the system via the radio transceiver, the remote controller configured for wireless control of the system.

6. The system according to claim 5, Wherein the remote controller further comprises a panic button for use by a remote user to warn the operator or optionally shutdown the machinery to stop movement closer to the power line.

7. The system according to claim 1, further comprising a memory device in communication with the micro-controller for storing computer program instructions and data.

8. The system according to claim 1, further comprising a user interface having buttons for controlling power, adjusting the first and second preset sensitivity levels and external communications.

9. The system according to claim 8, wherein the user interface further comprises a graphical display of field strength, alerts and warnings.

10. A method for remotely alerting an operator of machinery when a structure of the machinery is moved near a high voltage power line, the method comprising:
installing an antenna on the structure of the machinery that is movable near the high voltage power line, the antenna generating field strength signals based on proximity of the antenna to the high voltage power line;
generating proximity signals based on the field strength signals;
warning the operator when the structure is moved a first warning distance from the high voltage power line such that a first proximity signal generated from the field strength signal exceeds a first preset field sensitivity;
automatically shutting down the machinery when the structure is moved a second warning distance from the high voltage power line such that a second proximity signal generated from the field strength signal exceeds a second preset field sensitivity, the first warning distance exceeds the second warning distance and
allowing the operator to adjust each of the first warning distance and the second warning distance.

11. The method according to claim 10, wherein installing the antenna on the structure comprises installing a loop antenna about the structure;
sending a test signal through the loop antenna and detecting the test signal; and
graphically displaying each proximity signal on a color display, and warning the operator comprises audibly warning the operator.

12. The method according to claim 10, further comprising using a remote controller with a panic button to shutdown the machinery when the panic button is pressed.

13. A power line proximity sensing and warning system for use with machinery operating near a high-voltage power line, comprising:
an antenna disposed on a structure of the machinery that is movable near the power line;
a control system that includes a signal processor and a micro-controller;
the signal processor is in communication with the antenna and receives field strength signals from the antenna generated by an electromagnetic field from the power line; and
the micro-controller is in communication with the signal processor and interprets the received field strength signals and compares the received field strength signals to first and second preset: user-adjustable sensitivity levels, and automatically shuts down the machinery when the structure is close to the power line;
the first preset sensitivity level represents a first warning distance from the power line, and the micro-controller generates at least one of an audible warning and a visual warning when the field strength signal exceeds the first preset sensitivity level;
the second preset sensitivity level represents a second shut down distance from the power line that is less than the first warning distance, and the micro-controller shuts down the machinery when the field strength signal exceeds the second preset sensitivity level, and each of the first, warning distance and the second warning distance is user adjustable.

14. The system according to claim 13, wherein the control system further comprises an input/output (I/O) module in communication with the micro-controller that can communicate with external devices.

15. The system according, to claim 13, wherein the control system further comprises an event logger in communication with the micro-controller.

16. The system according to claim 13, further comprising a radio transceiver module in communication with the micro-controller, the radio transceiver module is capable of wireless communication with external wireless devices.

17. The system according to claim 16, further comprising a remote controller in communication with the control system via the radio transceiver module.

18. A power line proximity sensing and warning system for use with machinery operating near a high-voltage power line, comprising:
an antenna disposed on a structure of the machinery that is movable near the power line;
a control system that includes a signal processor and a micro-controller;
the signal processor is in communication with the antenna and receives field strength signals from the antenna generated by an electromagnetic field from the power line;
the micro-controller is in communication with the signal processor and interprets the received field strength signals and compares the received field strength signals to a user-adjustable sensitivity level, and automatically shuts down the machinery when the structure is close to the power line;

a radio transceiver module in communication with the micro-controller, the radio transceiver module is capable of wireless communication with external wireless devices;

a remote controller in communication with the control system via the radio transceiver module; and the remote controller further comprises a button that when pressed results in generation of a warning to an operator of the machinery that the structure of the machinery is close to the power line.

19. The system according to claim 17, wherein the remote controller further includes a button that when pressed causes the machinery to shutdown.

20. A power line proximity sensing and warning system for use with machinery operating near a high-voltage power line, comprising:

an antenna disposed on a structure of the machinery that is movable near the power line;

a control system that includes a signal processor and a micro-controller;

the signal processor is in communication with the antenna and receives field strength signals from the antenna generated by an electromagnetic field from the power line;

the micro-controller is in communication with the signal processor and interprets the received field strength signals and compares the received field strength signals to a user-adjustable sensitivity level, and automatically shuts down the machinery when the structure is close to the power line;

a radio transceiver module in communication with the micro-controller, the radio transceiver module is capable of wireless communication with external wireless devices; a remote controller in communication with the control system via the radio transceiver module;

the control system includes a first link button and an infrared transmitter; the remote controller includes a second link button and an infrared receiver; and the control system and the remote controller are configured so that the remote controller is linked to the control system by pressing the first link button and the second link button, the control system transmits a code via the infrared transmitter to the infrared receiver of the remote controller, and the remote controller uses the received code to establish a link with the control system.

21. A method for remotely alerting an operator of machinery when a structure of the machinery is moved near a high voltage power line, the method comprising:

installing an antenna on the structure of the machinery that is movable near the high voltage power line, the antenna generating field strength signals based on proximity of the antenna to the high voltage power line;

generating proximity signals based on the field strength signals;

warning the operator when the structure is moved a first warning distance from the high voltage power line such that a first proximity signal generated from the field strength signal exceeds a first preset field sensitivity;

automatically shutting down the machinery when the structure is moved a second warning distance from the high voltage power line such that a second proximity signal generated from the field strength signal exceeds a second preset field sensitivity, the first warning distance exceeds the second warning distance;

using a remote controller with a panic button to shutdown the machinery when the panic button is pressed;

a control system that can automatically shut down the machinery; the control system includes a first link button and an infrared transmitter; the remote controller includes a second link button and an infrared receiver; and establishing a link between the remote controller and the control system by pressing the first link button and the second link button so that the control system transmits a code via the infrared transmitter to the infrared receiver of the remote controller, and the remote controller receives the received code to establish the link with the control system.

* * * * *